United States Patent [19]

Misek

[11] 4,268,612
[45] May 19, 1981

[54] METHOD FOR MAKING RELIEF DEEPENINGS IN PRINTING PLATE MATERIALS

[76] Inventor: Vaclav Misek, 8515 Colonial Dr., Stockton, Calif. 95207

[21] Appl. No.: 75,501

[22] Filed: Sep. 13, 1979

Related U.S. Application Data

[63] Continuation-in-part of Ser. No. 947,891, Oct. 2, 1978, abandoned.

[51] Int. Cl.³ .............................................. G03C 5/00
[52] U.S. Cl. .................................. 430/306; 427/307; 427/346; 427/369; 427/371; 430/309; 430/310; 430/323; 430/325; 430/434
[58] Field of Search ............... 430/306, 309, 310, 323, 430/325, 434; 101/425; 427/307, 346, 369, 371

[56] References Cited

U.S. PATENT DOCUMENTS

| | | | |
|---|---|---|---|
| 3,169,066 | 2/1965 | Hoerner | 430/306 X |
| 3,271,226 | 9/1966 | Staehle et al. | 430/306 X |
| 3,874,945 | 4/1975 | Misek | 430/310 X |

Primary Examiner—Edward C. Kimlin
Attorney, Agent, or Firm—Blair, Brown & Kreten

[57] ABSTRACT

Disclosed is a method for making relief deepenings in solid, hydrophylic, adhesive printing plate materials.

The surface of the plate with an image unaffected by water is treated before making pressurized contact with another solid substance, i.e. removal medium. Non-imaged areas of the plate surface are softened and rendered actively adhesive by aforesaid treatment of water and are bonded to removal medium by said contact. Bond formed between plate parts and removal medium is terminated when the removal medium and the plate are forcefully separated; the removal medium carrying away the adhered plate material.

Various embodiments of this basic method include the mode of plate surface treatment, means for controlling formation of image supporting sidewalls and different forms of removal medium.

The method is employable with solid hydrophylic adhesive materials of organic or synthetic origin.

7 Claims, 4 Drawing Figures

METHOD FOR MAKING RELIEF DEEPENINGS IN PRINTING PLATE MATERIALS

REFERENCE TO PRIOR APPLICATION

This is a continuation-in-part of my patent application Ser. No. 947,891 filed Oct. 2, 1978, now abandoned.

BACKGROUND OF THE INVENTION

1. Field of Invention

This invention relates to the field of printing, particularly to the method for making relief deepenings in hydrophylic, adhesive printing plate materials by using a contact-separation motion to create and terminate an adhesive bond between the plate surface made adhesive and the removal medium.

2. Description of Prior Arts

Technological advances in the art of printing introduced new processes with emphasis on fast production of good quality printing plates for direct use on rotary printing presses, especially in the newspaper industry. Metal plates were found not to fulfill this requirement because they are slow in being processed, emit health hazardous fumes and are not ready for direct use.

Printing plates, particularly photopolymer water soluble plates, alleviated most of these problems. However, present processing methods are only satisfactory and require a negative. These methods utilizing pressurized spraying of the plate surface with heated water are primitive, not refined. They do not exert any control on the shaping and forming of sidewalls supporting the image. The formation of said sidewalls is determined by the hardening action of light which the plate receives at the time of exposure. Aforesaid demands a sharp, uniformly dense negative and perfect setting and functioning of the light source, factors which need due care and are not always achievable. It is known that the depth of relief is limited to the depth hardening effect of the light. Material not sufficiently hardened is washed away during processing. The relationship between the light hardening action and the reproductive quality of the plate is therefore established. Thus extended variations in the opacity of the paste-up or any deviations in the quantum of light endanger the reproductive quality of the plate.

Prior art techniques are also known to be inefficient in processing plates with halftone lineage higher than 65 lines, nor do said techniques process fine lines in reverse areas to the sufficient depth for quality reproduction.

Another impediment of these techniques is that the temperature of the plate rises to the temperature of the spraying solution and is kept at this high temperature during the entire processing time thereby rendering the plate vulnerable to fine detail washout. Due to the length of processing time said temperatures also cause partial hardening of plate material, hindering the removal efficiency of these methods resulting in shallowness of depth in reverse areas thereby reducing sharpness of image contrast in said areas of image. According to the manufacturer's instructions temperatures as high as 130 to 140 degrees may be encountered.

Because said techniques need an excessive amount of water to dissolve and wash away unhardened plastic material, the biodegradable breakdown process only reduces water pollution, it does not eliminate it. Furthermore while these techniques have shortened washout time to 3 to 4 minutes this amount is still considered lengthy for newspaper production where speed is so essential.

U.S. Pat. No. 3,661,660 to Wessells et al. and Patent teachings of Kleeberg et al. U.S. Pat. No. 3,957,512 and Takeda et al. U.S. Pat. No. 4,050,936 are limited to certain light sensitive chemical substances requiring action of light to cause explicit chemical changes in plate material. Reliability of said changes is entirely dependent on uniformity of light source and opacity of a negative thus being much more vulnerable to deviate than a non-chemical removal action as taught in present application. Furthermore said patents neither teach how to make relief in plate material when the image is formed without use of light nor how to control and form image supporting sidewalls as illustrated in present application FIG. 2; sidewalls designed to redress paper abrasive effect on image fine meshed screen parts.

Etching methods as taught in U.S. Pat. No. 3,271,226 to H. C. Steahle et al. and U.S. Pat. No. 3,411,973 to H. K. Siler are applied to hard plastic material softened by chemical solutions other than water and rely exclusively on a brushing motion to etch the plate. Said methods do not complete the etching step in one uninterrupted pass. The supporting treatment must be incorporated in the process, rendering these techniques time consuming. The structural characteristics of hydrophylic plates are much more responsive to absorbency and diffusion of water than cellulosic plate materials to semisolvents when treated as taught by Siler. Thus it is almost impossible to keep the plate surface under the stencilled image dry; a critical and imperative prerequisite of Siler's teaching. Further impediments of Siler's teaching when applied to hydrophylic printing plates are horizontal, uncontrolled movement of brush bristles and limitation of the amount of applied pressure on said bristles so as not to change brushing action to ineffective wiping.

Adaptability of Misek's teaching U.S. Pat. No. 3,874,945 to hydrophylic adhesive materials is difficult and limited. Basic principle of said Patent is to selectively apply solution to the plate by an etching medium and remove dissolved plate material by remaining absorbency of said medium or by blotting paper. When said method is applied to hydrophylic plate material the absorbency and diffusion of this material, when treated with water, is so great that said treatment impairs selectivity of etching medium application. Also capacity of etching medium to hold enough solution to dissolve hydrophylic plate material on contact is not feasible. When other means such as a brush is used to supply solution to the plate the ability to form and control image supporting sidewalls of said teaching is lost. Furthermore removal of plate dissolved material when in the form of liquid demands many more removal applications than when said material is only partially liquefied and is removed by adhesion. The present application teaches the removal of plate material by adhesion. To redress aforementioned impediments of Misek's Patent the present method divides the treatment of plate surface and removal of plate material into two separate functions independent of each other. Thus the treatment of plate surface with water can be controlled by omitting or repeating of this step in the processing cycle and action of removal medium can be enhanced by the supporting layer of resilient material so image sidewalls designated for long run as illustrated in FIG. 2 of present application are attainable. It was also found that supporting the etching medium by small rollers as taught in Misek's patent is ineffective in halftone areas of the image.

Thus previously described procedures are not feasible nor readily adaptable for use on water soluble, adhesive plate materials. They do not exploit advantages of said plates pertaining to speed, quality and ease of processing. Nor can they be adapted to said materials when image on the plate surface is formed by direct imaging without the use of light and a negative and said image acts as a stencil during plate processing.

SUMMARY OF THE INVENTION

Principal object of this invention is to provide a controlled processing method for relief printing plates with high reproductive quality and greater relief depth.

A further object of this invention is to minimize opacity variations of paste-up or negative and to eliminate the effect that any deviation of the light source will have on the reproductive quality of the plate.

Another object of this invention is to shorten the time of processing.

A further object of this invention is to offer the option to regulate and control the formation of image sidewalls.

A still further object of this invention is to substantially reduce water pollution.

One object of this invention is to provide greater depth of relief in halftone and reverse areas, thus retard the clogging of said areas with paper lint.

A further object of this invention is to diminish the dependability of the reproductive quality of the plate on the depth hardening effect of the light in the mass of the plate.

A still further object of this invention is to provide the printing plate image with specially shaped sidewalls wherein the damage inflicted due to paper abrassiveness on the fine meshed parts of the plate does not affect the reproductive quality of the plate and reproduction is maintained constant.

Yet another object of this invention is to eliminate the limitation of plate material to light sensitive substances.

A still further object of this invention is to use an image, formed on the surface of the plate by transfer or direct imaging, as a stencil pattern, whereby the need for a negative is obviated.

Other objects and advantages of the invention will become better understood hereinafter from a consideration of the specification with reference to the accompanying drawings forming part thereof, and in which like numerals correspond to like parts throughout the several views of the invention, and wherein.

DETAILED DESCRIPTION OF THE PREFERRED EMBODIMENTS

Figure 1:
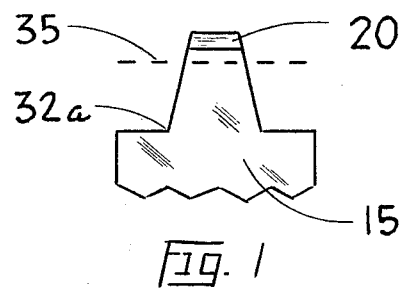
FIG. 1 is a detailed sectional view of a portion of a processed printing plate showing regular, acceptable supporting sidewalls of a halftone dot.

The first step in this method according to the preferred embodiment of the present invention is to select a plate matrix. The matrix can be composed of light sensitive materials such as water soluble photopolymer, sensitized gelatine, or polyvinyl alcohol when use of a negative is contemplated. Sensitizing of mentioned materials is a well known procedure to anyone in the printing art that it does not require elaboration. The matrix can also be composed of adhesive materials not affected by light such as plates made from gelatine, polyvinyl alcohol, polyvinyl acetate and other adhesives. To obtain desired degree of plate material adhesiveness and texture, finely grained particles of calcium carbonate, hydroxyethyl cellulose, hydrated magnesium aluminum silicate marketed under the names Nitrosol, Celosize, Attagel-40, are added and mixed in an appropriate ratio with said adhesives. Printing plates of good reproductive quality and ease of processing usually contain between 15 to 20% of said additives.

Hydrophylic adhesive materials in a solid state are only slightly adhesive therefore unable to form a strong bond upon contact. When these hydrophylic adhesive materials are exposed to a limited amount of water they absorb it and become increasingly adhesive, capable of making a strong bond upon contact with other materials. Thus if one chooses a hydrophylic adhesive printing plate material either light sensitive or not, such as polyvinyl alcohol or photopolymer, it is preferrable, according to the method characterized by the present invention, that the surface of the plate with a water resistant image is exposed to water prior to contact with the removal medium. Parts of the plate surface affected by said treatment i.e. accepting water, are rendered soft and adhesive, ready to be removed on contact by the removal medium. Aforesaid treatment facilitates removal of undesired plate material and assists in forming of image sidewalls. To increase efficiency of this treatment use of heated water is recommended. Different modes of preconditioning i.e. treating of said plate surface with water such as immersion or pouring or rolling of plate surface with water are compatible with this method. In one preferred application a layer of absorbent, spongy material containing the water is applied to the plate by a sliding motion. This manner of treatment tends to deposit more water in any plate surface crevices thus making these parts adhesive and adjoining areas soft, responding to the pressure of the removal medium and ready to be molded into a desirable shape. This manner of treatment was used when this invention was reduced to practice. The resilient, absorbent material was a layer of cellulosic sponge 0.750" thick, with a fine surface, saturated with heated water.

In order to obtain the most favorable degree of plate material adhesivity, resulting in peak removal efficiency, said treatment is controlled. Control consists of omitting or repeating of said treatments in the processing cycle. It is within the scope of this invention to use either one or both of these treatment controlling means in single plate processing.

Method described in this application anticipates two different procedures of providing the plate with an image not soluble by water so adhesive differences between said image and the rest of plate surface are achieved. Both of said procedures are based on the image's non-acceptance of water when the plate surface is exposed to it. In one of these procedures the light sensitive plate material is exposed to light through a negative making those parts of the plate surface struck by light water resistant, a process well known in the art. Another procedure is to form by direct imaging means such as electrostatic, Laser beam or transfer, an image on the plate surface. Purpose of said imaging is to cover and shield the plate surface beneath the image from accepting the water and becoming adhesive. In the field of direct image forming I refer to 3-M Company's Direct Imaging literature as an example. A wide selection of plate material to accommodate the desired form of imaging and still be economical is thus available. Excessive range in image opacity, often called density, of a paste-up or a negative causing poor reproductive quality of the plate made of light sensitive material is minimized by this method's independance of depth hardening in forming of image sidewalls. When light sensitive plate material is exposed to light through a negative the top of the image is always hardened enough not to become adhesive thus withstand the subtile removal action of this method without being affected by said variations. It is recommended to slightly underexpose the plate image so the contrast in halftone shadow areas can be easily and fully developed.

Figure 4:
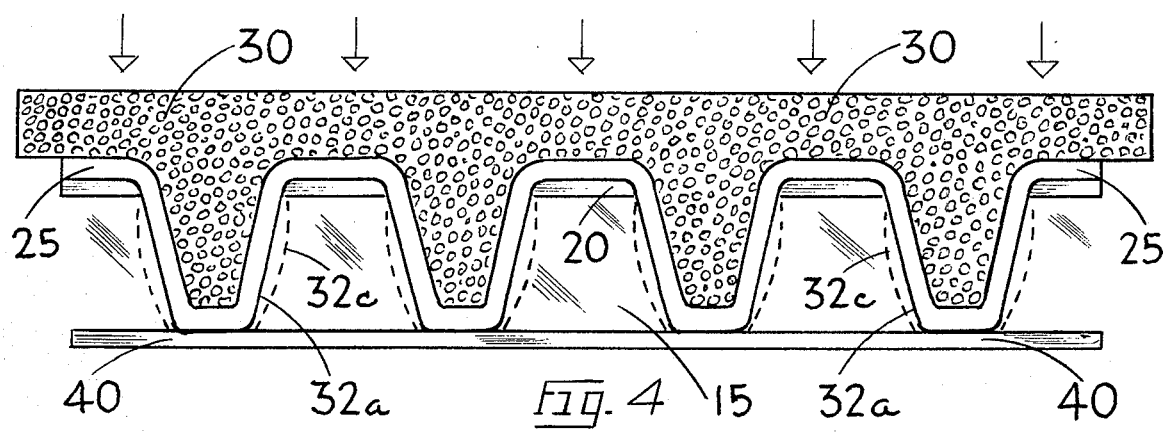
FIG. 4 is an enlarged sectional view of a printing plate in the last stage of processing, illustrating the application of removal medium and forming of specially shaped image sidewalls in the line areas of image according to an embodiment of the present invention.

The removal ability of this method is dependent on contact and degree of adhesivity of plate material to the medium. It is evident that plate material not contacted by removal medium is not removed even if it is pretreated with water. Only plate material rendered adhesive by water treatment and contacted by the medium is removed. Resiliency of the removal medium automatically adjusts the removal of plate material when constant pressure is exercised upon said medium during plate processing. Said medium penetrates and contacts the plate surface less in halftones than in line areas of the image, causing uneven removal and terminating said removal earlier in halftone areas. Removal continues uninterrupted in line areas of image. When desired depth is reached and removal medium's contact is with the backing of the plate, the removal action continues in a horizontal direction narrowing the image supporting sidewalls. This particular way of removal is helpful especially when the plate image has small dots isolated from other parts of the image. FIG. 4 of accompanying drawing shows such action of removal medium in last stages of processing where 15 is the plate material, 20 the image, 25 is the removal medium, 40 represents plate backing, solid line 32a shows normal sidewalls and dotted line 32c illustrates specially shaped sidewalls. The removal medium is supported by a thicker layer of resilient material, 30, to achieve desired depth. This action clearly demonstrates the almost unlimited relief depth and ability of this method to control the forming and shaping of image sidewalls by regulating the extent of contact i.e. size and strength of adhesive bond formed by contact between the plate surface and removal medium.

Figure 3:
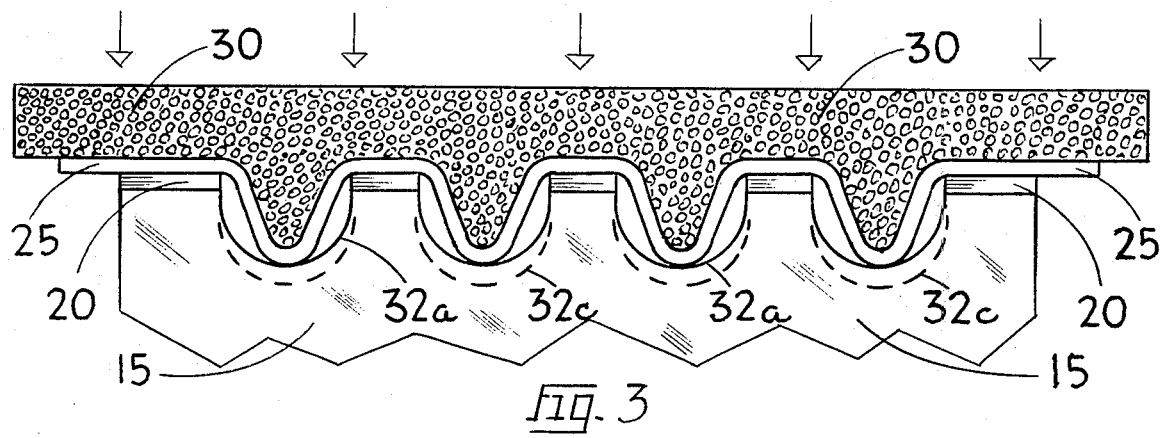
FIG. 3 is an enlarged sectional view of a partially processed printing plate illustrating the application of removal medium and forming of normal and specially shaped image sidewalls in halftone area of image according to an embodiment of the present invention.

FIG. 3 of accompanying drawing shows action of discardable removal medium in halftone areas of the image where 15 is the plate material, 20 the image, solid line 32a showing regular sidewalls and dotted line 32c illustrating specially shaped sidewalls. Said removal medium is in the form of a thin sheet of resilient material, 25, which is disposed of after use. It is supported by a layer of thicker resilient material, 30, to achieve desired removal depth. The thickness of the supporting layer exceeds the desired depth of relief. It is recommended that it be 3 or 5 times thicker. Said removal arrangement was used when the present invention was reduced to practice. Medium was the end of a roll of 16 lb. weight newsprint paper. Medium supporting layer was soft resilient polyurethane material with a finely porous surface in ¾ of an inch thickness. Processed plate was of hydrophylic adhesive material.

The discardable removal medium is a resilient stretchable material with a solid, uninterrupted, smooth surface of adequate tensile strength so as not to break under the stress of applied pressure. Said medium, by its own resiliency, resists being tightly wrapped around the top of any plate image elevation thereby forming vertical or slanted contact with plate surface.

The reuseable removal medium has the same material properties as the discardable medium. It may vary in shape, is nonabsorbent and consists of material of greater thickness. It is cleaned of adhered plate material before entering again into contact with the plate. It is contemplated to have suitable shapes to facilitate its own cleaning. As an example, when cleaning of medium is anticipated to be by centrifugal spin off, shape of said removal medium is in the form of a roller. Other means of cleaning said medium of attached plate parts such as the use of suction when a vaccum apparatus is placed in proximity of said medium is also compatible with this method. To avoid water pollution cleaned plate material is stored in absorbent materials such as sand, sawdust or other substances of a similar nature.

Both of the above types of removal mediums, the discardable and the reuseable, are claimed by this application.

Contact between imaged plate surface and removal medium is made by placing the said surface parallel to the removal medium followed by motion applied in a perpendicular direction to plate position. Vertical direction of said motion enhances the adhesive bond between the image and the plate surface when said image has little depth and is used as a stencil during plate processing.

During the first 2-3 contacts made between the treated plate surface having the image and removal medium, removal of the plate material is uniform, non selective. The entire surface area of the plate not covered by the image is rendered adhesive and is removed, forming sharp image edges and creating a slightly uneven surface. Further contacts continue to be gradually more and more dependent on resiliency of removal medium causing said removal to be selective and controllable. During these contacts the removal medium fits closely around any plate image elevations bonding only the adhesive plate material directly contacted. Plate material removal is subject to the area contacted and limited to the bond formed between the adhesive plate surface and the medium. Because of the absorbency and diffusion of water in hydrophylic plate material and the limited removal capacity of said medium, not all treated plate material is removed by each removal step. Softened, treated plate material which is left on the plate after each accomplished removal step is forced under pressure of the removal medium to the sides of the image, taking the contour design of said medium, thus verifying the ability to form image sidewalls as claimed by this method.

In one embodiment of the present invention control in the forming and shaping of image sidewalls is by increasing or decreasing the pressure under which the contact is made when resiliency of medium and medium supporting layer is maintained constant during plate processing.

In another embodiment of the present invention control in the forming and shaping of image supporting sidewalls is by increasing or decreasing the resiliency of removal medium while the pressure under which contact is made and resiliency of medium supporting layer are maintained constant. Said changes of medium resiliency are made by changing the thickness and/or the structural rigidity of said medium.

Yet in another embodiment of the present invention the forming and shaping of image supporting sidewalls is by increasing or decreasing the resiliency of medium supporting layer while the pressure under which contact is made and the resiliency of the removal medium are maintained constant. Said changes in the resiliency of the medium supporting layer are made by changing the thickness and/or the rigidity of said layer.

Figure 2:
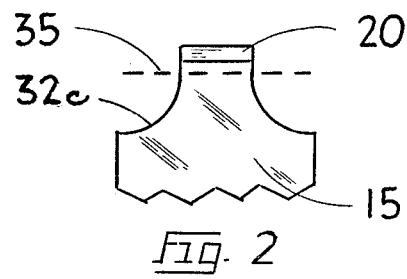
FIG. 2 is a detailed sectional view of a portion of a processed printing plate illustrating the sidewalls of a halftone dot specially shaped according to an embodiment of the present invention.

Image sidewalls as in FIG. 2 of accompanying drawing are attainable by use of any of the described procedures or any combination thereof. FIG. 2 shows how specially formed supporting sidewalls 32 remedy paper abrasive damage inflicted to the plate. Said sidewalls are formed by constant pressure of a stated quantum under which contact is made for the first 8 to 10 removal cycles thus forming vertical image supporting sidewalls between the image 20 and dotted line 35. By reducing to 75% said stated quantum of contact pressure balance of image supporting sidewalls are conical in shape. Whereas dot supporting sidewalls generally accepted and termed as "normal", 32 of FIG. 1, show at point 35 the enlargement of halftone dots causing image distortion.

If one chooses to utilize newsprint paper as a discardable removal medium, said paper of 16 lb. weight is of good service. This type of medium is adherent and pliable when used on water treated adhesive plates. It also enhances the removal embodiments of this method by helping to regulate water treatment of the plate surface by its own absorbency which is renewed with every fresh application of said medium. Printed newsprint paper requires 15% increase of removal steps when used as a removal medium. It is deemed preferable to maintain contact between the plate surface and the removal medium for a short finite period of time. When present invention was reduced to practice 15% of the cycle time was used for surface plate treatment and 70% of the time was used for medium contact. The balance was down time. Sufficient pressure in range of 0.040 to 0.65 P.S.I. under which contact was made resulted in a good quality plate. Under such conditions about 45 to 50 removal cycles processed a NAPP plate to the relief depth of 0.020" in line and open areas of the plate image and to the depth of 0.003 to 0.006" in halftone areas without any loss of dots and said halftones being of 120 lines screen.

During aforementioned processing all undesirable plate material and any occurring water excess was removed from the plate by a newsprint paper removal medium of 16 lb. weight. Hence the non-pollutant embodiment of this method is confirmed.

As has been indicated, contacted areas are removed by causing plate material to become adhesive in order to be bonded to the medium. Water temperatures used for plate treatment range from 140 degrees Fahrenheit to 160 degrees Fahrenheit and are found to yield good results. Processing of aforementioned NAPP plate took 1 min. 35 sec. when treated with water at 130 degrees Fahrenheit and 1 min. 10 sec. at 150 degrees Fahrenheit.

The "Dyna Flex" plate took 1 min. 45 sec. and 1 min. 30 sec. when water temperatures were 110 and 135 degrees Fahrenheit respectively. Contact pressure was constant at 0.45 P.S.I. Above treatments produced a relief printing plate of very good quality according to an expert's examination. It is believed that mentioned processing time can be shortened to 1 min. or even less by application of higher temperatures than 150 degrees Fahrenheit. Use of water temperatures higher than those recommended by plate manufacturers is compatible with this method of processing as it exposes the plate surface to these temperatures only for a short, limited time so the temperature of the plate seldom reaches the temperature of the water.

It is a known fact that photopolymer and similar plates need to be hardened, known as "curing" after undesired plate material is removed. Said time needed for hardening of photopolymer can be incorporated in this processing method by using up the "down-time" of said method. By synchronizing the removal step with the hardening period further shortening of processing time is achievable.

Down time of this processing method can be also used for cleaning plate material residue from the water treatment device when malfunction of plate treatment occurs.

It is seen that the details recited herein are exemplary and are not intended to be limiting. The invention is limited only by the appended claims.

What is claimed is:

1. A method for fabricating a printing plate comprising the steps of:
    (a) providing an hydrophilic material as plate material on a plate backing with an adhesive substance within said plate material that is water activated,
    (b) exposing portions of said plate material with radiation whereby portions so exposed becomes less hydrophilic than unexposed portions,
    (c) applying water on said plate material thereby activating said adhesive substance on the unexposed more hydrophilic portions,
    (d) placing a removal medium on and parallel to said plate material,
    (e) moving said removal medium in a direction perpendicular to said plate material whereby such motion enhances an adhesive bond between the exposed areas of said plate material and said plate backing while simultaneously removing more hydrophilic unexposed portions to thereby provide an image.

2. The method of claim 1 further including: repeating the steps of claim 1 plural times to improve image contrast.

3. The method of claim 2 including providing said removal medium with a resilent support backing to enhance said removal medium penetration within interstices of said plate material.

4. The method of claim 3 including varying the resilencey of said resilient support backing during plural repetitions of the steps of claim 1.

5. The methods of claim 3 including varying the pressure associated with the vertical motion during plural repetitions of the steps of claim 1.

6. The method of claim 3 including heating the water prior to application on said plate material.

7. The method of claim 6 including applying water to the plate from a sponge material and laterally sliding the sponge over the plate.

* * * * *